(12) United States Patent  
Kadota et al.

(10) Patent No.: US 12,166,470 B2  
(45) Date of Patent: Dec. 10, 2024

(54) ACOUSTIC WAVE DEVICE

(71) Applicant: Murata Manufacturing Co., Ltd., Nagaokakyo (JP)

(72) Inventors: Michio Kadota, Sendai (JP); Shuji Tanaka, Sendai (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 416 days.

(21) Appl. No.: 17/487,215

(22) Filed: Sep. 28, 2021

(65) Prior Publication Data  
US 2022/0014174 A1 Jan. 13, 2022

Related U.S. Application Data

(63) Continuation of application No. PCT/JP2020/010295, filed on Mar. 10, 2020.

(30) Foreign Application Priority Data

Mar. 29, 2019 (JP) ................. 2019-067025

(51) Int. Cl.  
*H03H 9/17* (2006.01)  
*H03H 9/02* (2006.01)  
*H03H 9/56* (2006.01)

(52) U.S. Cl.  
CPC ........ *H03H 9/175* (2013.01); *H03H 9/02031* (2013.01); *H03H 9/176* (2013.01);  
(Continued)

(58) Field of Classification Search  
CPC .... H03H 9/175; H03H 9/02031; H03H 9/176; H03H 9/564; H03H 9/568; H03H 9/02614; H03H 9/589; H03H 9/605  
See application file for complete search history.

(56) References Cited

U.S. PATENT DOCUMENTS

2004/0256961 A1 12/2004 Namba et al.  
2007/0080611 A1* 4/2007 Yamada ................. H03H 9/174  
310/364  
(Continued)

FOREIGN PATENT DOCUMENTS

JP 2000-138555 A 5/2000  
JP 2005-033775 A 2/2005  
(Continued)

OTHER PUBLICATIONS

Official Communication issued in International Patent Application No. PCT/JP2020/010295, mailed on Jun. 9, 2020.

*Primary Examiner* — Andrea Lindgren Baltzell  
*Assistant Examiner* — Kimberly E Glenn  
(74) *Attorney, Agent, or Firm* — Keating & Bennett, LLP

(57) ABSTRACT

An acoustic wave device includes a support substrate, a piezoelectric body, an acoustic layer laminate, first and second electrodes, and a lead-out electrode. The first electrode is on a first main surface of the piezoelectric body, the second electrode is on a second main surface of the piezoelectric body, the lead-out electrode is on the first main surface or the second main surface of the piezoelectric body, the lead-out electrode is electrically connected to the first electrode or the second electrode, side surface grooves extend from the first main surface side of the piezoelectric body, and the side surface grooves are provided in at least a portion of a remaining portion excluding a portion provided with the lead-out electrode from a region in an outer side portion of at least one of the first electrode and the second electrode.

22 Claims, 19 Drawing Sheets

(52) U.S. Cl.
CPC ............ *H03H 9/562* (2013.01); *H03H 9/564* (2013.01); *H03H 9/568* (2013.01)

(56) References Cited

U.S. PATENT DOCUMENTS

| | | |
|---|---|---|
| 2018/0191322 A1 | 7/2018 | Chang et al. |
| 2018/0226939 A1 | 8/2018 | Inoue et al. |

FOREIGN PATENT DOCUMENTS

| | | | | |
|---|---|---|---|---|
| JP | 2010-021914 A | 1/2010 | | |
| JP | 2015-228620 A | 12/2015 | | |
| JP | 2018-110379 A | 7/2018 | | |
| KR | 20100023892 A | * | 3/2010 | .............. H03H 9/54 |
| WO | 2017/026257 A1 | 2/2017 | | |

\* cited by examiner

ACOUSTIC WAVE DEVICE

CROSS REFERENCE TO RELATED APPLICATIONS

This application claims the benefit of priority to Japanese Patent Application No. 2019-067025 filed on Mar. 29, 2019 and is a Continuation Application of PCT Application No. PCT/JP2020/010295 filed on Mar. 10, 2020. The entire contents of each application are hereby incorporated herein by reference.

BACKGROUND OF THE INVENTION

1. Field of the Invention

The present invention relates to an acoustic wave device including an acoustic layer laminate in which a plurality of acoustic layers are laminated and a piezoelectric body laminated on the acoustic layer laminate.

2. Description of the Related Art

Various acoustic wave devices using bulk waves have been proposed. In an acoustic wave device described in Japanese Unexamined Patent Application Publication No. 2015-228620, a piezoelectric body is laminated on an acoustic layer. The acoustic layer includes an acoustic layer laminate in which a high-impedance acoustic film having a relatively high acoustic impedance and a low-impedance acoustic film having a relatively low acoustic impedance are laminated. By laminating the piezoelectric body on the acoustic layer laminate, the bulk wave can be confined in the piezoelectric body.

In order to excite the piezoelectric body described above, a first electrode and a second electrode are provided in contact with the piezoelectric body.

In Japanese Unexamined Patent Application Publication No. 2015-228620, the piezoelectric body is cut together with the acoustic layer laminate along outer peripheries of the first electrode and the second electrode that are in contact with the piezoelectric body. For this reason, wiring using a wire electrode is necessary for electrical connection with another electrode or terminal. However, when a plurality of acoustic wave devices are electrically connected to form a circuit such as a filter, there is a problem that wiring becomes complicated.

SUMMARY OF THE INVENTION

Preferred embodiments of the present invention provide acoustic wave devices that are each able to be easily electrically connected to outside or to another electronic component element portion.

An acoustic wave device according to a preferred embodiment of the present invention includes a support substrate, a piezoelectric body including a first main surface and a second main surface opposed to the first main surface, a first electrode provided on the first main surface of the piezoelectric body, a second electrode provided on the second main surface of the piezoelectric body, an acoustic layer laminate between the second main surface and the support substrate, and a lead-out electrode electrically connected to the first electrode or the second electrode and provided on the first main surface or the second main surface of the piezoelectric body, the piezoelectric body includes a groove in at least a portion of a remaining portion excluding a portion including the lead-out electrode from a region in an outer side portion of at least one of the first electrode and the second electrode in a plan view from a thickness direction of the piezoelectric body.

An acoustic wave filter device according to a preferred embodiment of the present invention includes a piezoelectric body including a first main surface and a second main surface opposed to the first main surface, a plurality of electrodes on each of the first main surface and the second main surface of the piezoelectric body, an acoustic layer laminate laminated on the second main surface of the piezoelectric body and including a plurality of acoustic layers that are laminated, and a support substrate laminated on an opposite side of the acoustic layer laminate to the piezoelectric body, a plurality of acoustic wave resonators are defined by the piezoelectric body and the plurality of electrodes provided on each of the first main surface and the second main surface of the piezoelectric body, and a groove is provided from a side of the first main surface of the piezoelectric body, and the plurality of acoustic wave resonators are electrically connected to each other by the plurality of electrodes provided on the second main surface of the piezoelectric body so as to avoid the groove.

According to preferred embodiments of the present invention, it is possible to provide acoustic wave devices that are each able to be easily electrically connected to outside or to another electronic component element portion.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing specific preferred embodiments of the present invention with reference to the drawings.

It should be noted that the preferred embodiments described in the present specification are exemplary, and partial replacement or combination of configurations between different preferred embodiments is possible.

Figure 1:
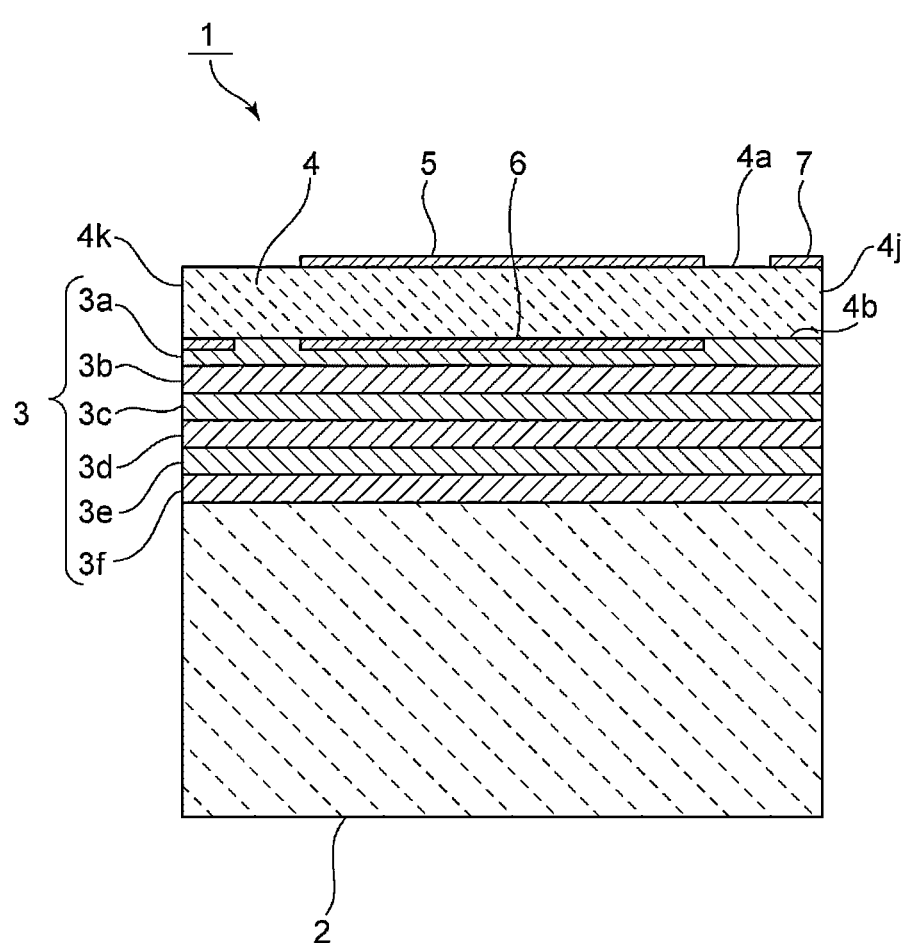
FIG. 1 is a sectional view of an acoustic wave device according to a first preferred embodiment of the present invention, and is a sectional view of a portion taken along a line X1-X1 in FIG. 2A.
Figure 2A:
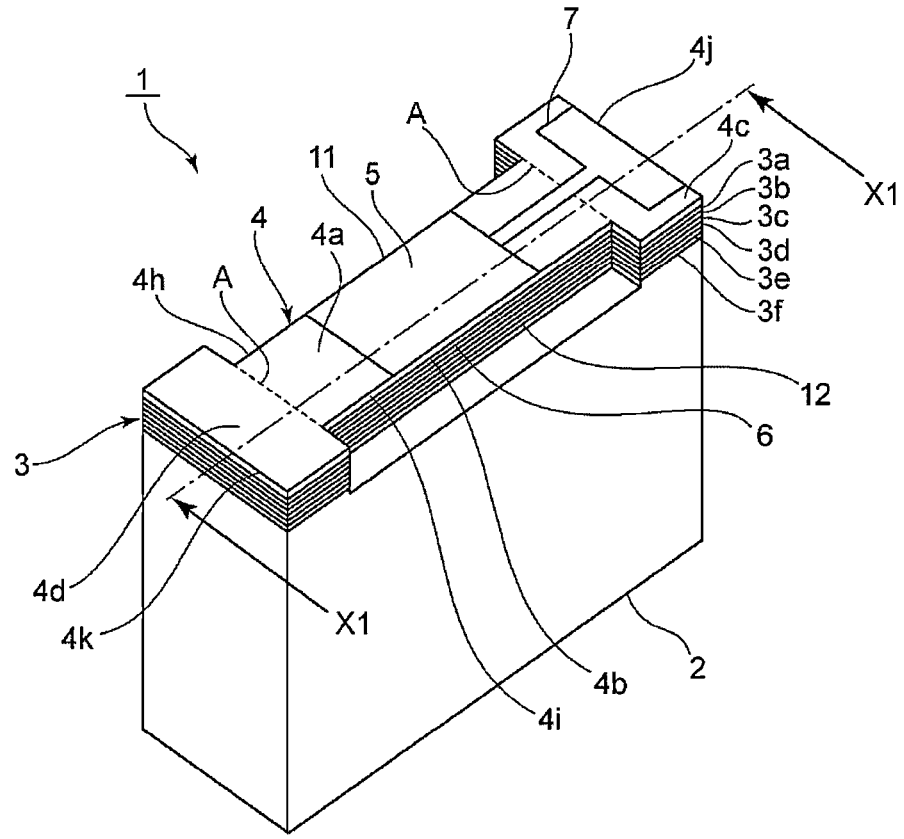
FIG. 2A is a perspective view illustrating an external appearance of the acoustic wave device according to the first preferred embodiment of the present invention.

FIG. 1 is a sectional view of an acoustic wave device according to a first preferred embodiment of the present invention, and is a sectional view of a portion taken along a line X1-X1 in FIG. 2A, and FIG. 2A is a perspective view illustrating an external appearance.

An acoustic wave device 1 includes a support substrate 2. The support substrate 2 is made of Si, for example. However, a material of the support substrate 2 is not particularly limited. For example, a semiconductor other than Si, or an insulator such as glass, a dielectric, or the like can be used.

An acoustic layer laminate 3 and a piezoelectric body 4 are laminated on the support substrate 2. The acoustic layer laminate 3 includes a plurality of acoustic layers 3a to 3f. The acoustic layer 3a, the acoustic layer 3b, the acoustic layer 3c, the acoustic layer 3d, the acoustic layer 3e, and the acoustic layer 3f are laminated in this order from a side of the piezoelectric body 4. In the present preferred embodiment, the acoustic layer laminate 3 includes six acoustic layers 3a to 3f, for example. However, the number of acoustic layers is not limited thereto. Here, an example in which the lamination number is six is illustrated. Each of the acoustic layers 3a, 3c, and 3e is a low acoustic impedance layer having a relatively low acoustic impedance. Each of the acoustic layers 3b, 3d, and 3f is a high acoustic impedance layer having a relatively high acoustic impedance. Materials of the low acoustic impedance layers and materials of the high acoustic impedance layers are not particularly limited as long as the above-described relative relationship between the acoustic impedances is satisfied. However, materials having various acoustic impedances shown in the following Tables 1 and 2 can be used, for example.

The following Table 1 shows materials that can be used for the acoustic layers in order of numerical values of acoustic impedances Zl ($Ns/m^3$) of a longitudinal wave. The following Table 2 shows materials that can be used in order of numerical values of acoustic impedances Zs ($Ns/m^3$) of a transversal wave.

TABLE 1

| Material | Density (kg · $m^3$) | c33 | Vl (m/s) | Zl ($Ns/m^3$) | c44 | V (m/s) | Zs ($Ns/m^3$) |
|---|---|---|---|---|---|---|---|
| Mg alloy | 1800 | 7.222E+10 | 6334 | 1.14E+07 | 1.667E+10 | 3043 | 5.48E+06 |
| $SiO_2$ | 2210 | 7.850E+10 | 5960 | 1.32E+07 | 3.120E+10 | 3757 | 8.30E+06 |
| Al | 2699 | 1.113E+11 | 6422 | 1.73E+07 | 2.610E+10 | 3110 | 8.39E+06 |
| Ti | 4510 | 1.661E+11 | 6069 | 2.74E+07 | 4.380E+10 | 3116 | 1.41E+07 |
| ZnO | 5665 | 2.096E+11 | 6083 | 3.45E+07 | 4.230E+10 | 2733 | 1.55E+07 |
| $Si_xN_y$ | 3200 | 3.710E+11 | 10767 | 3.45E+07 | 1.130E+11 | 5942 | 1.90E+07 |
| AlN | 3260 | 3.950E+11 | 11008 | 3.59E+07 | 1.180E+11 | 6016 | 1.96E+07 |
| SiC | 3200 | 4.580E+11 | 11963 | 3.83E+07 | 1.650E+11 | 7181 | 2.30E+07 |
| $Al_2O_3$ | 3800 | 4.170E+11 | 10476 | 3.98E+07 | 1.460E+11 | 6198 | 2.36E+07 |
| Ag | 10500 | 1.527E+11 | 3814 | 4.00E+07 | 3.290E+10 | 1770 | 1.86E+07 |
| Cu | 8930 | 2.106E+11 | 4856 | 4.34E+07 | 5.140E+10 | 2399 | 2.14E+07 |
| $TiO_2$ | 4249 | 4.700E+11 | 10517 | 4.47E+07 | 1.232E+11 | 5385 | 2.29E+07 |
| Ni | 8845 | 3.115E+11 | 5934 | 5.25E+07 | 9.290E+10 | 3241 | 2.87E+07 |
| Au | 19300 | 2.202E+11 | 3378 | 6.52E+07 | 2.990E+10 | 1245 | 2.40E+07 |

TABLE 1-continued

| Material | Density (kg·m³) | c33 | Vl (m/s) | Zl (Ns/m³) | c44 | V (m/s) | Zs (Ns/m³) |
|---|---|---|---|---|---|---|---|
| Ta | 16678 | 2.668E+11 | 4000 | 6.67E+07 | 8.249E+10 | 2224 | 3.71E+07 |
| Mo | 10219 | 4.696E+11 | 6779 | 6.93E+07 | 1.068E+11 | 3233 | 3.30E+07 |
| Pt | 21400 | 3.356E+11 | 3960 | 8.47E+07 | 5.968E+10 | 1670 | 3.57E+07 |
| W | 19265 | 5.214E+11 | 5202 | 1.00E+08 | 1.604E+11 | 2885 | 5.56E+07 |

TABLE 2

| Material | Density (kg·m³) | c33 | Vl (m/s) | Zl (Ns/m³) | c44 | V (m/s) | Zs (Ns/m³) |
|---|---|---|---|---|---|---|---|
| Mg alloy | 1800 | 7.222E+10 | 6334 | 1.14E+07 | 1.667E+10 | 3043 | 5.48E+06 |
| SiO$_2$ | 2210 | 7.850E+10 | 5960 | 1.32E+07 | 3.120E+10 | 3757 | 8.30E+06 |
| Al | 2699 | 1.113E+11 | 6422 | 1.73E+07 | 2.610E+10 | 3110 | 8.39E+06 |
| Ti | 4510 | 1.661E+11 | 6069 | 2.74E+07 | 4.380E+10 | 3116 | 1.41E+07 |
| ZnO | 5665 | 2.096E+11 | 6083 | 3.45E+07 | 4.230E+10 | 2733 | 1.55E+07 |
| Ag | 10500 | 1.527E+11 | 3814 | 4.00E+07 | 3.290E+10 | 1770 | 1.86E+07 |
| Si$_x$N$_y$ | 3200 | 3.710E+11 | 10767 | 3.45E+07 | 1.130E+11 | 5942 | 1.90E+07 |
| AlN | 3260 | 3.950E+11 | 11008 | 3.59E+07 | 1.180E+11 | 6016 | 1.96E+07 |
| Cu | 8930 | 2.106E+11 | 4856 | 4.34E+07 | 5.140E+10 | 2399 | 2.14E+07 |
| TiO$_2$ | 4249 | 4.700E+11 | 10517 | 4.47E+07 | 1.232E+11 | 5385 | 2.29E+07 |
| SiC | 3200 | 4.580E+11 | 11963 | 3.83E+07 | 1.650E+11 | 7181 | 2.30E+07 |
| Al$_2$O$_3$ | 3800 | 4.170E+11 | 10476 | 3.98E+07 | 1.460E+11 | 6198 | 2.36E+07 |
| Au | 19300 | 2.202E+11 | 3378 | 6.52E+07 | 2.990E+10 | 1245 | 2.40E+07 |
| Ni | 8845 | 3.115E+11 | 5934 | 5.25E+07 | 9.290E+10 | 3241 | 2.87E+07 |
| Mo | 10219 | 4.696E+11 | 6779 | 6.93E+07 | 1.068E+11 | 3233 | 3.30E+07 |
| Pt | 21400 | 3.356E+11 | 3960 | 8.47E+07 | 5.968E+10 | 1670 | 3.57E+07 |
| Ta | 16678 | 2.668E+11 | 4000 | 6.67E+07 | 8.249E+10 | 2224 | 3.71E+07 |
| W | 19265 | 5.214E+11 | 5202 | 1.00E+08 | 1.604E+11 | 2885 | 5.56E+07 |

Note that the materials of the low acoustic impedance layers and the high acoustic impedance layers are not limited to the materials shown in Table 1 and Table 2, and, for example, alloys, carbides, oxides, or nitrides of these metals can be used.

For the low acoustic impedance layers, for example, an Mg alloy, SiO$_2$, Al, Ti (in a case of a transversal wave), ZnO, or the like is preferably used. Additionally, for the high acoustic impedance layers, ZnO, Ag, SiN, AlN, Cu, TiO$_2$, SiC, Al$_2$O$_3$, Au, Ni, Mo, Hf, Pt, Ta, W, or the like is preferably used. In addition, alloys, oxides, nitrides, or carbides of metals such as Au, Ni, Mo, Hf, Pt, Ta, and W are also preferably used.

The piezoelectric body 4 is made of, for example, a piezoelectric single crystal such as LiTaO$_3$ or LiNbO$_3$. However, the piezoelectric body 4 may be made of a polycrystal such as AlN, ScAlN, or ZnO, for example.

The piezoelectric body 4 is a piezoelectric thin plate having a thickness of about 0.5 μm to about 3 μm, for example. The piezoelectric body 4 includes a first main surface 4a and a second main surface 4b opposed to the first main surface 4a. The second main surface 4b is in contact with the acoustic layer laminate 3.

Further, the piezoelectric body 4 includes a pair of side surfaces 4h and 4i and a pair of end surfaces 4j and 4k.

Figure 2B:
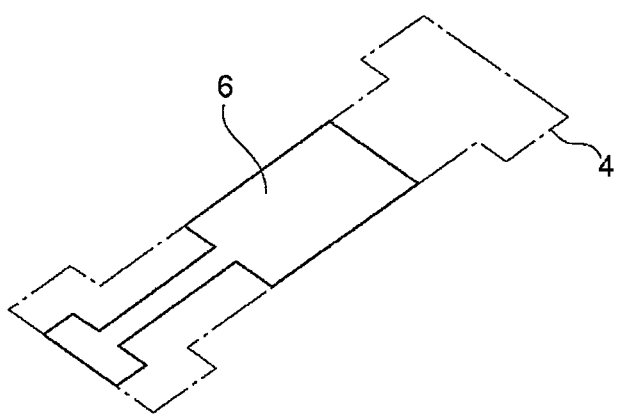
FIG. 2B is a perspective view for describing a shape of a second electrode in the acoustic wave device according to the first preferred embodiment of the present invention.

A first electrode 5 is provided on the first main surface 4a of the piezoelectric body 4. A second electrode 6 is provided on the second main surface 4b so as to be opposed to the first electrode 5. FIG. 2B is a perspective view illustrating a shape of the second electrode 6. In FIG. 1, the second electrode 6 is embedded into the acoustic layer 3a. However, the second electrode 6 may be embedded at the piezoelectric body 4 side, instead of the acoustic layer 3a. By applying an AC electric field between the first electrode 5 and the second electrode 6, for example, thickness shear vibration occurs in a region where the first electrode 5 and the second electrode 6 are opposed to each other, and a bulk wave is excited. As a result, resonance characteristics due to the bulk wave are obtained.

Since the acoustic layer laminate 3 is provided, the bulk wave described above is confined in the piezoelectric body 4. Thus, good resonance characteristics can be obtained.

Materials of the first and second electrodes 5 and 6 described above are not particularly limited, and various metals or alloys can be used as the materials of the first and second electrodes 5 and 6.

Preferably, an area of the second electrode 6 is equal to or larger than an area of the first electrode 5. In this case, the second electrode 6 can be used to connect a plurality of resonators as will be described later.

In the present preferred embodiment, the piezoelectric body 4 has a rectangular or substantially rectangular plate shape although the shape is not limited thereto. As an example, the piezoelectric body 4 has a rectangular or substantially rectangular parallelepiped shape with a length direction and a width direction. Note that, in the present invention, the piezoelectric body is not limited to one with the rectangular or substantially rectangular plate shape, and may have various planar shapes such as a circular shape, a fan shape, or a polygonal shape, for example.

In the piezoelectric body 4 of the present preferred embodiment, the pair of side surfaces 4h and 4i extend in the length direction of the piezoelectric body 4. In addition, the end surfaces 4j and 4k extend in the width direction of the piezoelectric body 4.

Figure 23:
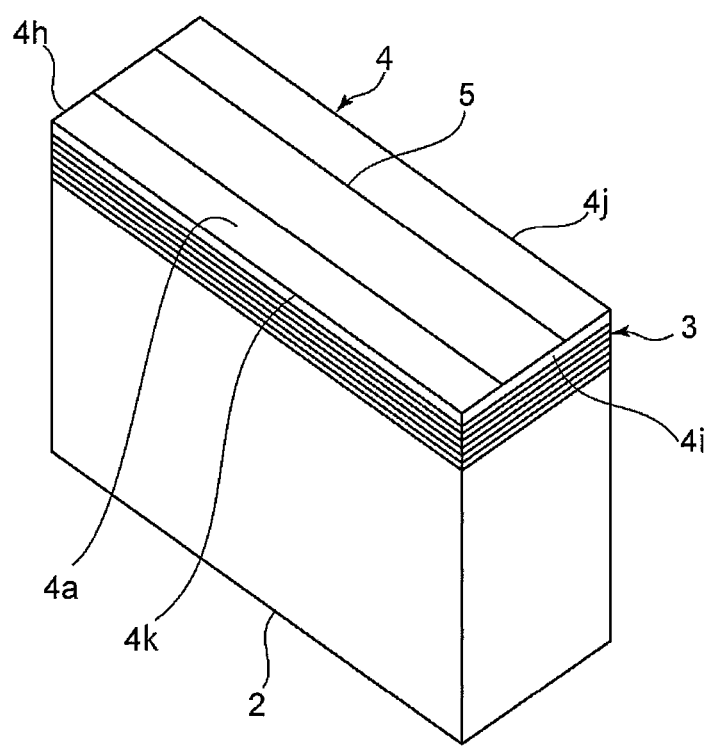
FIG. 23 is a perspective view illustrating a modified example of the acoustic wave device according to the first preferred embodiment of the present invention.

However, in the present invention, as illustrated in FIG. 23, the length direction of the piezoelectric body 4 may be a direction connecting the side surfaces 4h and 4i. In this case, the pair of side surfaces 4h and 4i extend in the width direction of the piezoelectric body 4.

As illustrated in FIG. 2A, in a structure in which the piezoelectric body 4 and the acoustic layer laminate 3 are laminated, side surface grooves 11 and 12 as a pair of grooves are provided in an outer side portion of a portion where the first electrode 5 is provided.

Inner side surfaces configuring grooves of the side surface grooves 11 and 12 described above match the side surfaces 4h and 4i, and are parallel or substantially parallel to each other. The side surface grooves 11 and 12 are parallel or substantially parallel to the outer peripheries of the first electrode 5 and the second electrode 6. The inner side surfaces configuring the grooves of the side surface grooves 11 and 12 are provided so as to be in contact with the first electrode 5, but may be provided in the vicinity of the first electrode 5 and may not be in contact with the first electrode 5.

Figure 24:
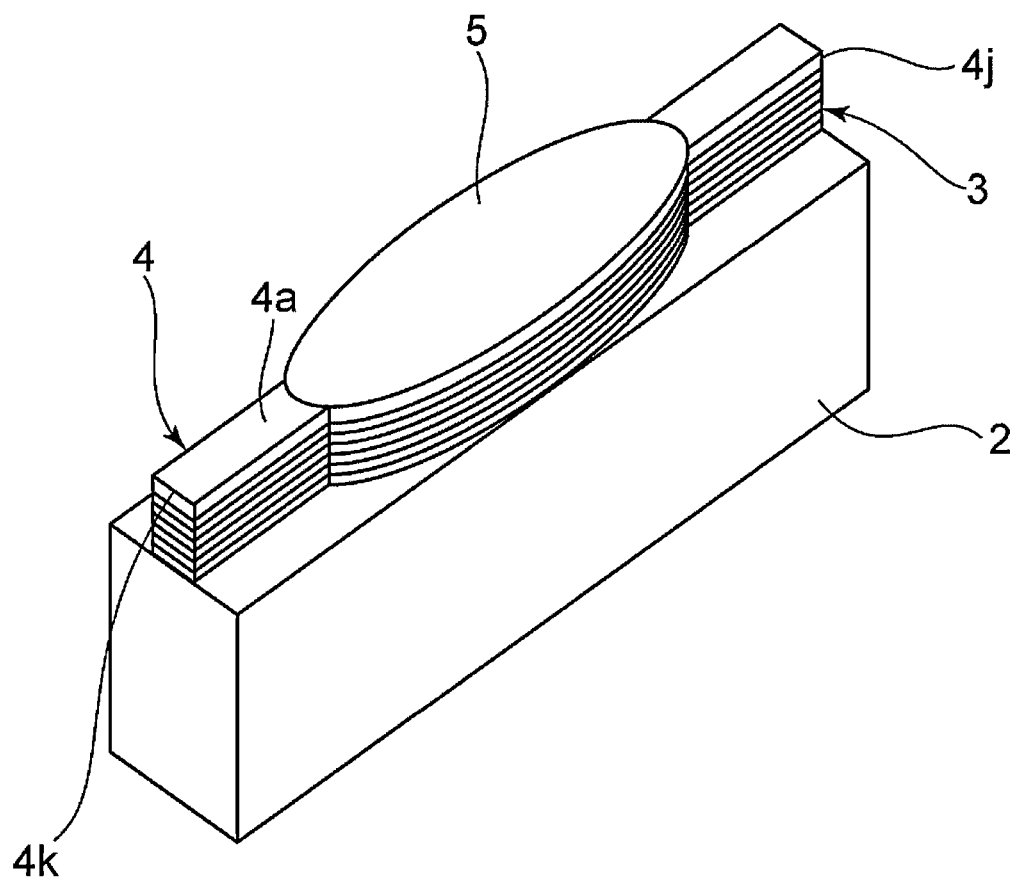
FIG. 24 is a perspective view for describing another modified example of the first preferred embodiment of the present invention.

In the present invention, a planar shape of an opposing portion of the first electrode 5 and the second electrode 6 is not limited to a rectangular or substantially rectangular. As illustrated in FIG. 24, the first electrode may have another shape, such as an elliptical or substantially elliptical shape, and the planar shapes of the first electrode 5 and the second electrode 6 are not particularly limited. Note that, in the structure illustrated in FIG. 24, a planar shape of the pair of grooves is a non-linear shape. As described above, the planar shape of the pair of grooves is not limited to a linear shape, and may be various shapes such as a zigzag shape, a curved shape, or a concave-convex shape, for example.

In FIG. 2A, the side surface grooves 11 and 12 extend downward from the first main surface 4a, and reach the support substrate 2 in the present preferred embodiment. That is, depths of the side surface grooves 11 and 12 are set to a depth that extends beyond the piezoelectric body 4 and reaches the inside of the acoustic layer laminate 3 or the inside of the support substrate 2.

The acoustic wave device 1 is a bulk wave resonator using a thickness shear mode in the piezoelectric body 4. In this case, as a frequency is increased, a thickness of the piezoelectric body 4 is decreased and sizes of the electrodes are decreased. That is, at a vibration portion where the first electrode 5 and the second electrode 6 are opposed to each other, the size of the piezoelectric body 4 becomes small. In the present preferred embodiment, since the side surface grooves 11 and 12 can be formed by, for example, etching, a size of the vibration portion can be sufficiently reduced to cope with increasing the frequency. Further, in a case of forming the grooves by dicing, for example, when the size thereof becomes small, there is a concern that a crack occurs or a groove having a non-linear shape cannot be formed. By etching, such a crack is unlikely to occur, and a groove having a non-linear shape can be easily formed. Thus, the side surface grooves 11 and 12 are preferably formed by etching.

Moreover, the side surface grooves 11 and 12 do not extend to both ends of the piezoelectric body 4 in a longitudinal direction. That is, the side surface grooves 11 and 12 having a length between the broken lines A in FIG. 2A are provided. Thus, regions 4c and 4d are provided at outer side portions of the side surface grooves 11 and 12 in the longitudinal direction. Dimensions of the regions 4c and 4d in the width direction are larger than a width of the vibration portion where the first electrode 5 and the second electrode 6 are opposed to each other. That is, since the side surface grooves 11 and 12 are not provided, the dimensions of the regions 4c and 4d in the width direction are increased. Thus, an area of a lead-out electrode 7 connected to the first electrodes 5 can be made sufficiently large on the region 4c.

That is, in the present invention, the side surface grooves are provided in the first main surface of the piezoelectric body, and the grooves are provided in at least a portion of a remaining portion excluding a portion provided with the lead-out electrode from (a) a region in an outer side portion of a portion where the first electrode or the second electrode is provided or (b) a region in an outer side portion of a portion where the first electrode and the second electrode are provided. According to this, the area of the lead-out electrode can be made sufficiently large as described above.

Thus, even when the frequency is increased, electrical connection with the outside or another electronic component element portion can be easily performed.

Note that regarding the second electrode 6, the lead-out electrode can also have a large area at a side of the lower surface opposed to the region 4d of the piezoelectric body 4 at a side of the second main surface 4b of the piezoelectric body 4. Thus, electrical connection with the outside of the second electrode 6 can be easily electrically performed as will be described later.

Figure 3:
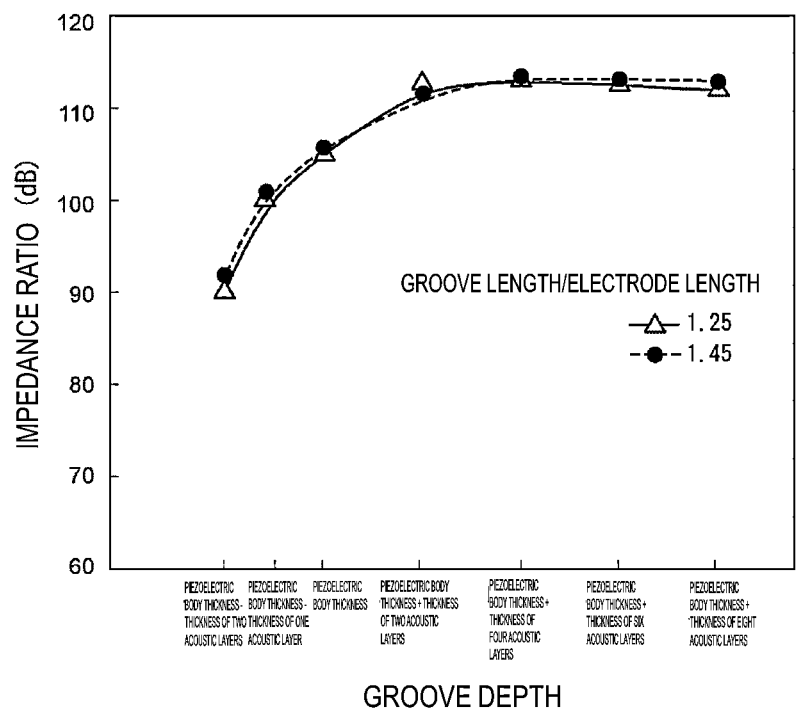
FIG. 3 is a diagram showing a relationship between a depth of a side surface groove and an impedance ratio.

FIG. 3 is a diagram showing a relationship between a groove depth of the side surface grooves 11 and 12 and an impedance ratio in resonance characteristics of the acoustic wave device. The impedance ratio is a ratio of an impedance $Za$ ($\Omega$) at an anti-resonant frequency to an impedance $Zr$ ($\Omega$) at a resonant frequency, and is expressed by $20 \times \log (Za/Zr)$ [dB]. Since Q has a strong correlation with the impedance ratio, Q characteristics can be improved when the impedance ratio is large. Thus, for example, when a band-pass filter using a plurality of acoustic wave devices is provided, it is possible to increase the steepness of filter characteristics and to reduce a loss in a pass band.

Note that FIG. 3 shows results related to the acoustic wave device 1 using the following materials.

The piezoelectric body 4: $LiTaO_3$, the dimensions of the opposing portion of the first and second electrodes 5 and 6: about 150 μm×about 30 μm, each of the thicknesses of the first and second electrodes 5 and 6: about 10 nm, the material of the high acoustic impedance layers: W, the material of the low acoustic impedance layers: Al, and the material of the first and second electrodes 5 and 6: Al are set.

In FIG. 3, the results in cases where the ratio of the length of the side surface grooves 11 and 12/the electrode length are about 1.25 and about 1.45 are shown. When the first electrode or the second electrode has a trapezoidal shape or a fan shape, the electrode length in the length direction is defined as an average value of the electrode length.

As shown in FIG. 3, it is understood that the impedance ratio gradually increases as the depth of the side surface grooves 11 and 12 is increased. It can be seen from FIG. 3 that, for example, in order to set the impedance ratio to be equal to or larger than about 100 dB, the groove depth of the side surface grooves 11 and 12 may be set to be equal to or larger than (a piezoelectric body thickness—a thickness of one acoustic layer). Here, the piezoelectric body thickness is the thickness of the piezoelectric body 4.

In addition, it can be seen that when the groove depth of the side surface grooves 11 and 12 is equal to or larger than the thickness of the piezoelectric body 4, the impedance ratio can be, for example, equal to or larger than about 105 dB. More preferably, the depth of the side surface grooves 11 and 12 is, for example, equal to or larger than (the thickness of the piezoelectric body 4+a thickness of two acoustic layers). That is, it is more preferable that the depth is equal to or larger than a total thickness of the thickness of the piezoelectric body 4 and the thicknesses of the acoustic layers 3a and 3b that are the first layer and the second layer, respectively, from the piezoelectric body 4 side. As a result, the impedance ratio can be made to be equal to or larger than about 110 dB, for example.

Figure 4A:
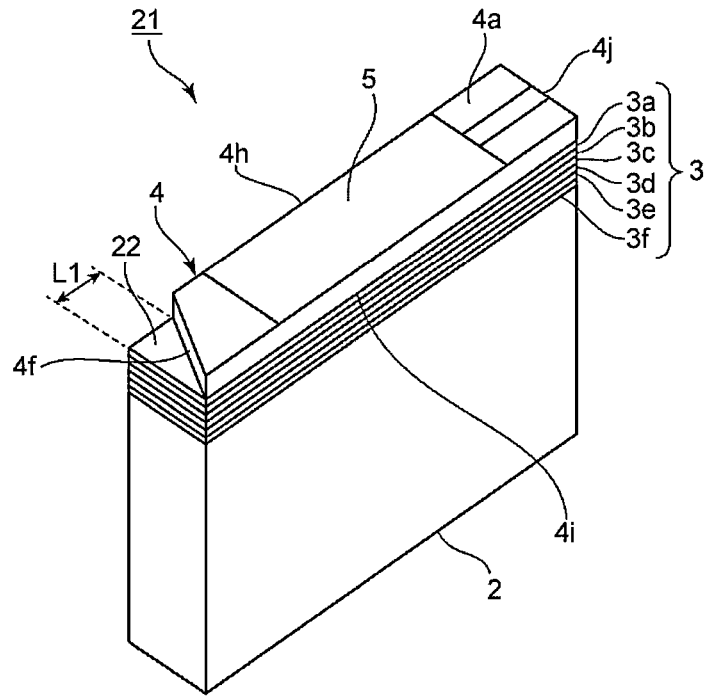
FIG. 4A is a perspective view of an acoustic wave device according to a second preferred embodiment of the present invention.

FIG. 4A is a perspective view of an acoustic wave device according to a second preferred embodiment of the present invention. In an acoustic wave device 21 according to the second preferred embodiment, an end surface groove 22 is provided at the end surface 4f of the piezoelectric body 4. Note that because of being provided at an outer side portion of the end surface 4f, the term of the end surface groove 22 is used. The end surface groove 22 is provided at the outer side portion of a portion provided with the first electrode 5 at one end side in the longitudinal direction of the piezoelectric body 4. The end surface 4f of the piezoelectric body 4 faces the end surface groove 22. Thus, here, the end surface 4f defines a side surface of the end surface groove 22. The end surface groove 22 has a triangular or substantially triangular shape including one corner portion of the piezoelectric body 4 in a plan view. Thus, the end surface 4f of the piezoelectric body 4 facing the end surface groove 22 is not perpendicular or substantially perpendicular to the length direction of the first electrode 5. Additionally, the length direction of the first electrode 5 and the end surface groove 22 are not parallel or substantially parallel to each other.

Figure 5:
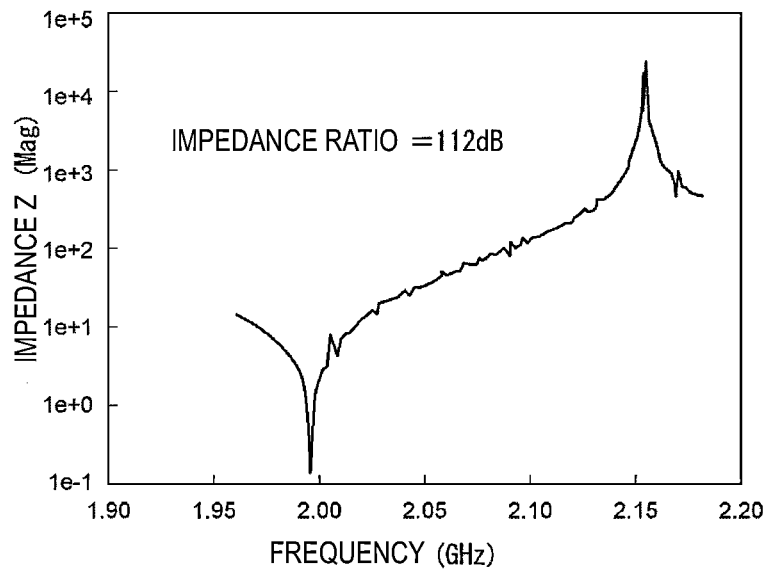
FIG. 5 is a diagram showing impedance characteristics of the acoustic wave device according to the second preferred embodiment of the present invention.

As described above, the side surface of the groove in the present invention does not need to be perpendicular or substantially perpendicular to the first electrode 5 or the longitudinal direction of the piezoelectric body 4, and may have a shape in which at least a portion thereof is non-perpendicular. Additionally, the groove may be non-parallel to the length direction or the width direction of the first electrode 5 or the longitudinal direction of the piezoelectric body 4. The groove may be non-parallel to the outer peripheries of the first electrode 5 and the second electrode 6. FIG. 5 shows impedance characteristics of a resonator of the acoustic wave device according to the second preferred embodiment. Here, the support substrate 2, the acoustic layer laminate 3, the piezoelectric body 4, and the first and second electrodes 5 and 6 are the same as or similar to those in the first preferred embodiment.

The piezoelectric body 4 has, for example, a length of about 150 μm, a width of about 30 μm, and a thickness of about 1 μm. The dimensions of the end surface groove 22 are set so as to satisfy a dimension L1 in FIG. 4A=about 20 μm and a depth=about 1μ m.

Figure 4B:
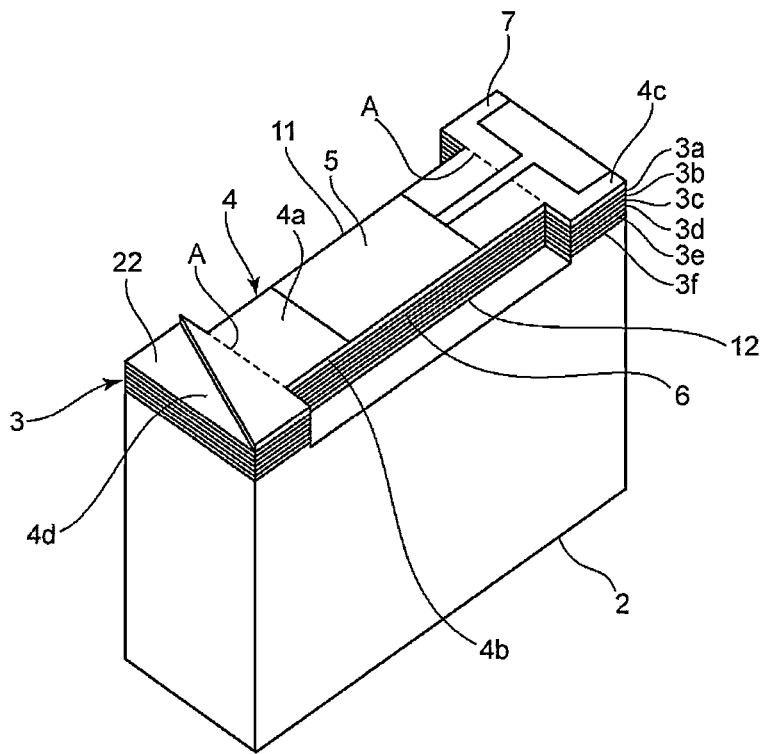
FIG. 4B is a perspective view of a modified example of the acoustic wave device according to the second preferred embodiment of the present invention.

FIG. 4B illustrates a working example in a case where one end surface groove 22 is provided in addition to the side surface grooves 11 and 12, and the end surface groove 22 is provided at the end in the longitudinal direction of the electrode.

FIG. 5 shows the characteristics of the resonator illustrated in FIG. 4A.

Figure 6:
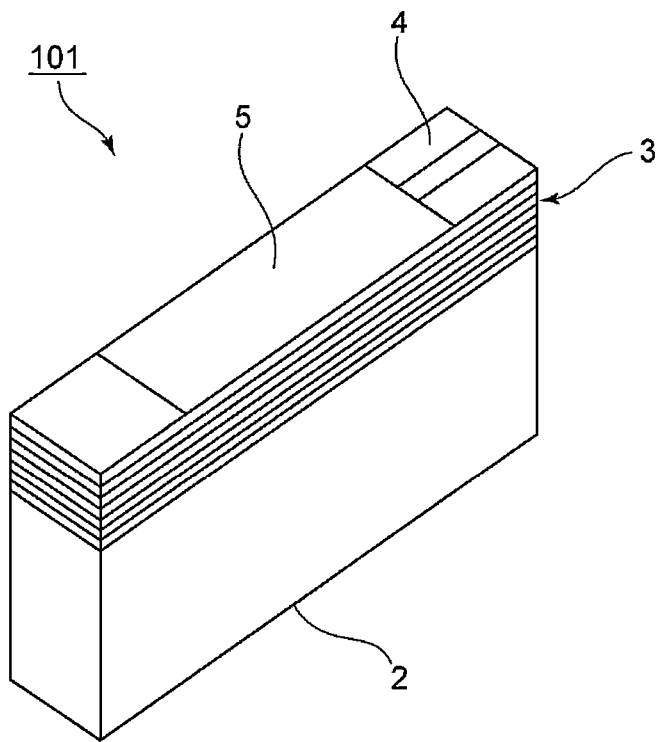
FIG. 6 is a perspective view of an acoustic wave device according to a comparative example.

As is apparent from FIG. 5, the impedance ratio is, for example, about 112 dB that is large. FIG. 6 is a perspective view of an acoustic wave device according to a comparative example. An acoustic wave device 101 according to the comparative example is similar to the acoustic wave device 21, except that the above-described end surface groove 22 in FIGS. 4A and 4B are not provided.

Figure 7:
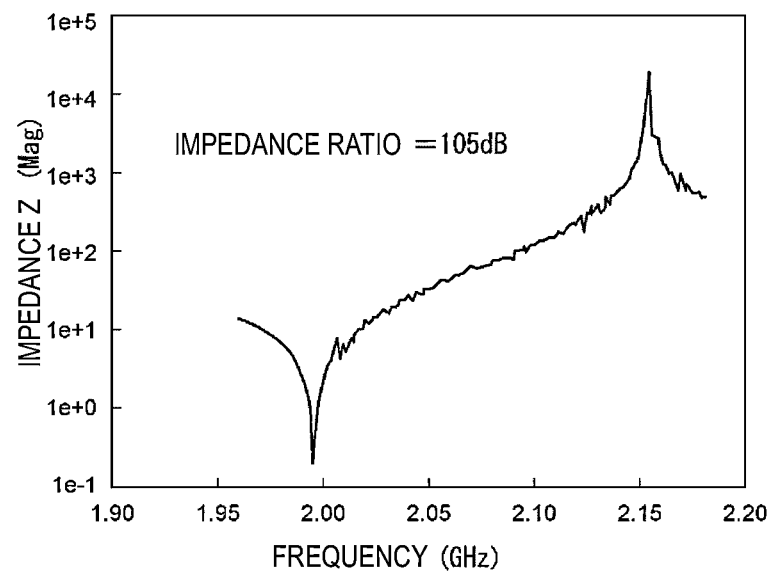
FIG. 7 is a diagram showing impedance characteristics of the acoustic wave device according to the comparative example.

FIG. 7 shows impedance characteristics of the acoustic wave device 101 according to the comparative example. As is apparent from FIG. 7, the impedance ratio is about 105 dB. Thus, it is understood that the impedance ratio can be effectively increased by providing the end surface groove 22. This is considered to be because the end surface groove 22 is not provided in the comparative example, whereas the end surface groove 22 is provided non-parallel to the first electrode 5 in the present preferred embodiment, and thus, the impedance ratio is increased.

Figure 8:
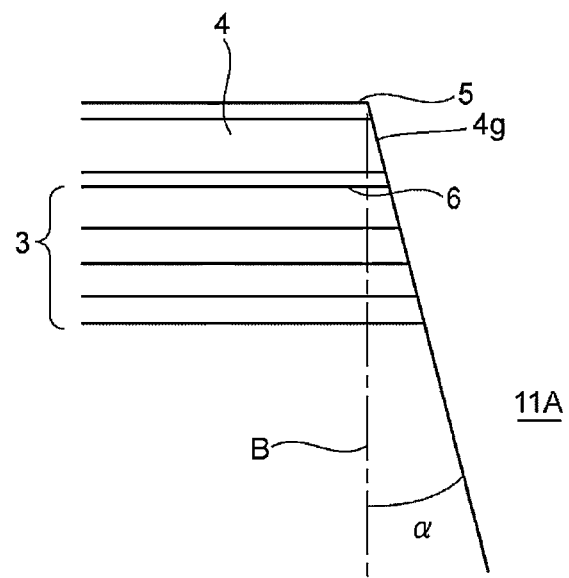
FIG. 8 is a schematic view for describing an inclination angle of a side surface exposed to a side surface groove.

In the acoustic wave device according to a preferred embodiment of the present invention, the side surface grooves 11 and 12 and the end surface groove 22 may be inclined in the thickness direction of the piezoelectric body 4 and the acoustic layer laminate 3. FIG. 8 is a schematic view for describing the inclination angle of the side surface exposed to the side surface groove. A side surface groove 11A that is deeper than the thickness of both the piezoelectric body 4 and the acoustic layer laminate 3 is provided. An inclination angle α of a side surface 4g exposed to the side surface groove 11A is an angle between the side surface 4g and a direction B orthogonal or substantially orthogonal to the first main surface 4a of the piezoelectric body 4.

In this manner, the side surface 4g exposed to the side surface groove 11A may be inclined from the normal direction with respect to the first main surface 4a of the piezoelectric body 4. In this case, the side surface 4g may not have a tapered shape, but may have a reversely tapered shape. Further, in the section illustrated in FIG. 8, the side surface of the groove does not need to have a linear shape as illustrated in the figure, and may have, for example, a curved shape or a shape having concave and convex portions.

Figure 9:
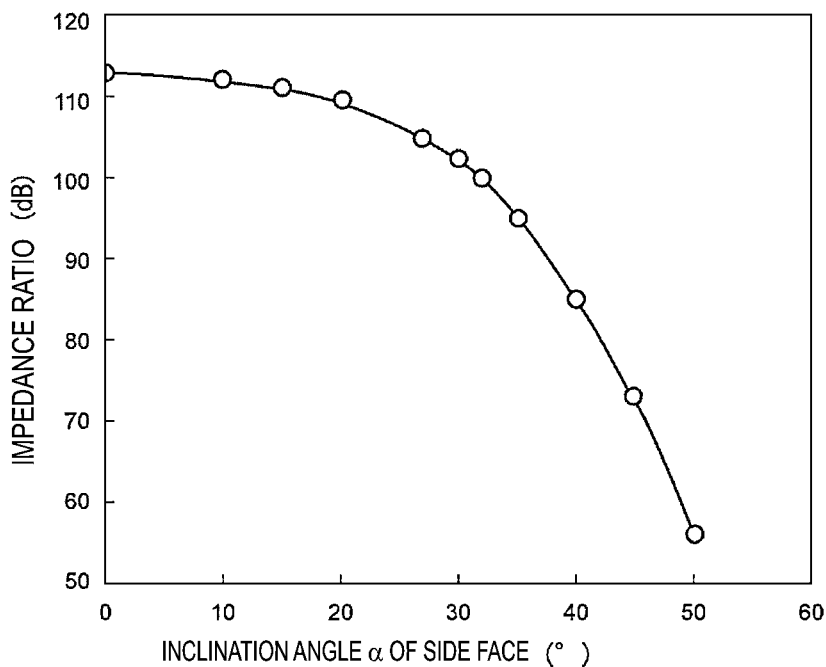
FIG. 9 is a diagram showing a relationship between the inclination angle of the side surface exposed to the side surface groove and an impedance ratio.

FIG. 9 is a diagram showing a relationship between the inclination angle α of the above-described side surface and an impedance ratio. Here, the acoustic wave device is configured in the same or a similar manner to that in the first preferred embodiment, except for the inclination angle α described above.

As is apparent from FIG. 9, for example, when the inclination angle α is equal to or smaller than about 32°, the impedance ratio can be set to be equal to or larger than about 100 dB. More preferably, the inclination angle & is equal to or smaller than about 27°. In this case, the impedance ratio can be set to be equal to or larger than about 105 dB. Still more preferably, the inclination angle α is equal to or smaller than about 20°. In this case, the impedance ratio can be set to be equal to or larger than about 110 dB.

Figure 10:
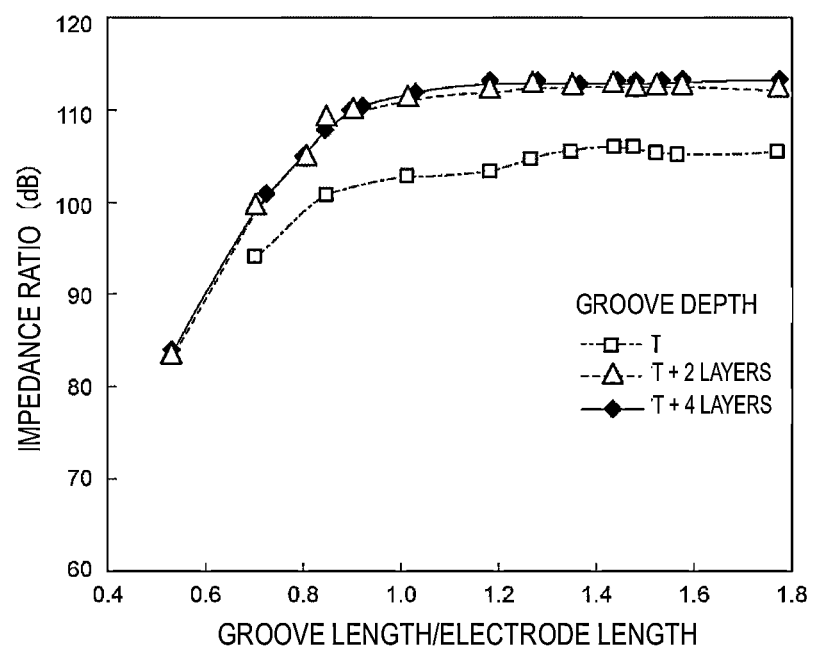
FIG. 10 is a diagram showing a relationship between a groove length/an electrode length and an impedance ratio.

In the acoustic wave device 1 according to the first preferred embodiment, the side surface grooves 11 and 12 are provided parallel or substantially parallel to the longitudinal direction of the first electrode 5. That is, the side surface grooves 11 and 12 are provided at the outer side portions of long sides of the first electrode 5 so as to be adjacent to the first electrode 5. FIG. 10 is a diagram showing a relationship between a groove length/an electrode length and an impedance ratio in this structure. Here, the groove length is a dimension along the longitudinal direction of the piezoelectric body 4 in the side surface grooves 11 and 12. FIG. 10 shows a relationship between the groove depth/the electrode length and the impedance ratio in a case where the groove depth corresponds to 1T, 1T+two layers of the acoustic layers, or 1T+four layers of the acoustic layers. Note that T in the groove depth means the thickness of the piezoelectric body 4. Other design parameters are the same as or similar to those in the first preferred embodiment.

As shown in FIG. 10, the ratio of the groove length/the electrode length is preferably equal to or larger than about 0.7, for example. In this case, the impedance ratio can be set to be equal to or larger than about 100 dB. More preferably, the groove length/the electrode length is equal to or larger than about 0.8, for example, and in this case, the impedance ratio can be set to be equal to or larger than about 105 dB. Still more preferably, the groove length/the electrode length is equal to or larger than about 0.87, for example. In this case, the impedance ratio can be set to be equal to or larger than about 110 dB. In addition, when the groove length/the electrode length is equal to or larger than about 0.87, the advantageous effect of improving the impedance ratio is improved or maximized.

Each of the acoustic wave devices described above is an acoustic wave resonator. Hereinafter, an example of an acoustic wave device defining and functioning as an acoustic wave filter device according to the present invention will be described.

Figure 11:
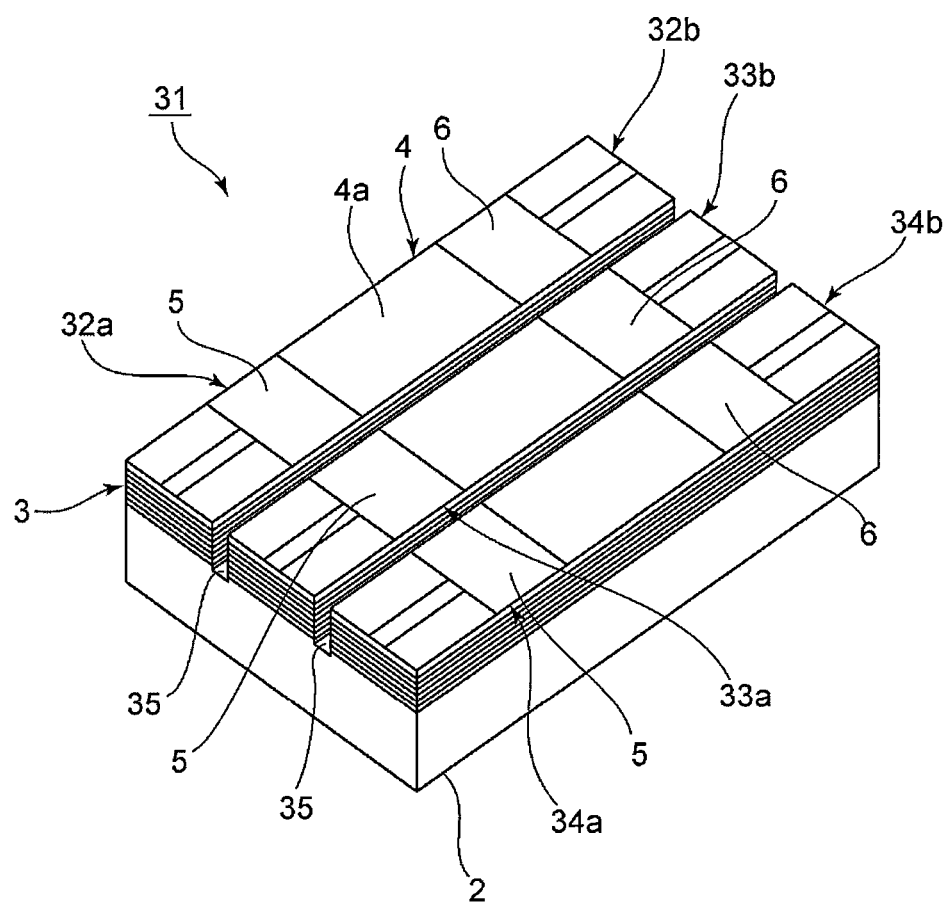
FIG. 11 is a perspective view of an acoustic wave device according to a third preferred embodiment of the present invention.
Figure 12:
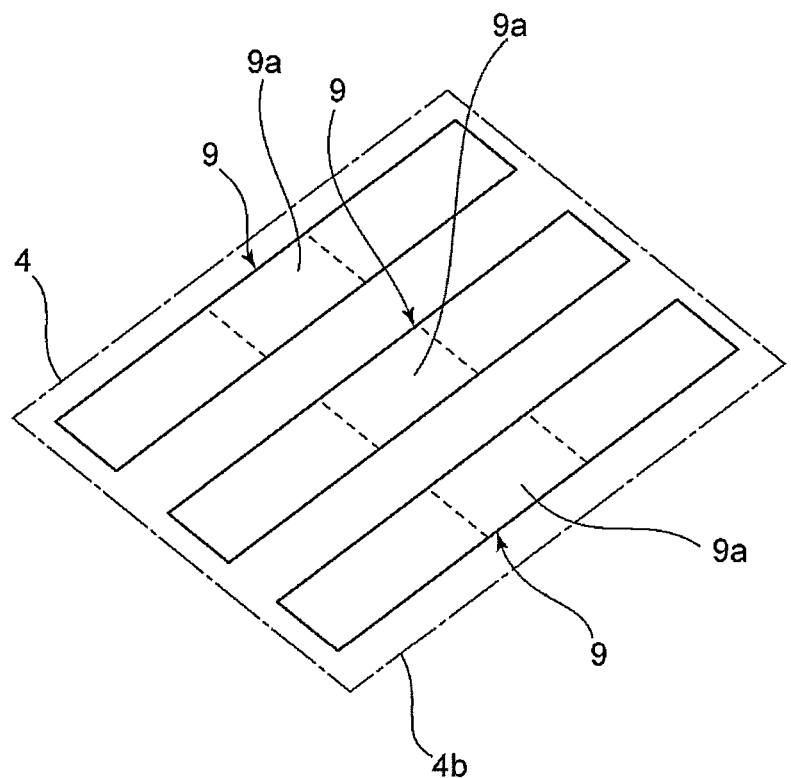
FIG. 12 is a perspective view illustrating electrodes on a lower surface of a piezoelectric body in the acoustic wave device according to the third preferred embodiment of the present invention.

FIG. 11 is a perspective view of an acoustic wave device according to a third preferred embodiment of the present invention, and FIG. 12 is a perspective view for describing electrodes provided on the lower surface of the piezoelectric body 4 in the third preferred embodiment.

An acoustic wave device 31 includes a plurality of acoustic wave resonators 32a and 32b to 34a and 34b that are integrated. The acoustic wave resonators 32a and 32b include the acoustic layer laminate 3 and the piezoelectric body 4 that are laminated on the support substrate 2. The first electrode 5 and the second electrode 6 are provided on the first main surface 4a of the piezoelectric body 4 so as to be separated from each other in the longitudinal direction of the piezoelectric body 4. Electrodes 9 are provided on the lower surface of the piezoelectric body 4. The electrode 9 is opposed to the first and second electrodes 5 and 6 with the piezoelectric body 4 interposed therebetween. A portion where the first electrode 5 and the electrode 9 are opposed to each other defines the acoustic wave resonator 32a. A portion where the second electrode 6 and the electrode 9 are opposed to each other defines the acoustic wave resonator 32b. As illustrated in FIG. 12, a portion of the electrode 9 sandwiched between a pair of broken lines defines and functions as a lead-out electrode 9a. The acoustic wave resonator 32a and the acoustic wave resonator 32b are connected by the lead-out electrode 9a.

The other acoustic wave resonators 33a, 33b, 34a, and 34b also have the same or similar structure. A portion of the electrode 9 between the acoustic wave resonator 33a and the acoustic wave resonator 33b similarly corresponds to a lead-out electrode. Further, a portion of the electrode 9 between the acoustic wave resonator 34a and the acoustic wave resonator 34b also corresponds to a lead-out electrode. The acoustic layer laminate 3 is provided between the support substrate 2 and the piezoelectric body 4.

Moreover, grooves 35 are provided at outer side portions of the first and second electrodes 5 and 6. The groove 35 is shared by the adjacent acoustic wave resonators 32a and 33a. The adjacent acoustic wave resonators 32a and 33a are separated from each other by the groove 35. The adjacent acoustic wave resonators 32b and 33b are also separated by the groove 35. The groove 35 is provided so as to penetrate the piezoelectric body 4 from the first main surface 4a of the piezoelectric body 4 and so as to also penetrate the acoustic layer laminate 3, as with the side surface groove 11 and the side surface groove 12.

In the present preferred embodiment, the groove 35 is provided in at least a portion of the remaining portion excluding the portion corresponding to the lead-out electrode from the region in the outer side portion of the portions where the first electrode 5 and the second electrode 6 are provided. That is, in a preferred embodiment of the present invention, since the groove is provided from the first main surface side, a plurality of acoustic wave resonators may be electrically connected to each other by a plurality of electrodes provided on the second main surface 4b of the piezoelectric body 4 so as to avoid the groove.

The groove 35 is also provided between the acoustic wave resonators 33a and 33b and the acoustic wave resonators 34a and 34b.

Figure 13:
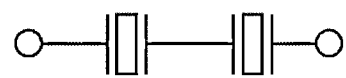
FIG. 13 is a circuit diagram of the acoustic wave device to the third preferred embodiment of the present according invention.
Figure 13:
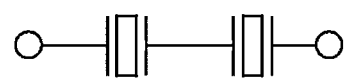
Figure 13:

In the acoustic wave device 31, as illustrated by the circuit diagram in FIG. 13, six acoustic wave resonators are provided.

As in the acoustic wave device 31 according to the third preferred embodiment, the plurality of acoustic wave resonators may be integrated by the grooves 35. Also in this case, since the grooves 35 are provided, even in a case where the frequency is increased, it is possible to be easily electrically connected with the outside or to another electrical element portion at the outer side portion of the portions where the first and second electrodes and 6 are provided. Note that the widths, lengths, and thicknesses of the electrodes in the six acoustic wave resonators 32a and 32b to 34a and 34b in FIG. 11 do not need to be the same.

Figure 14A:
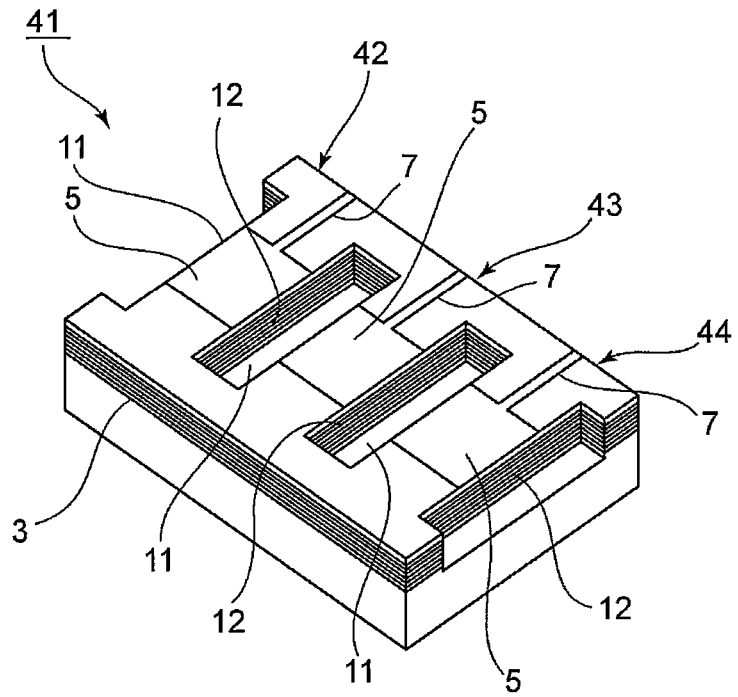
FIGS. 14A and 14B are perspective views of an acoustic wave device according to a fourth preferred embodiment of the present invention, and a perspective view for describing an electrode on a lower surface of a piezoelectric body, respectively.
Figure 14B:
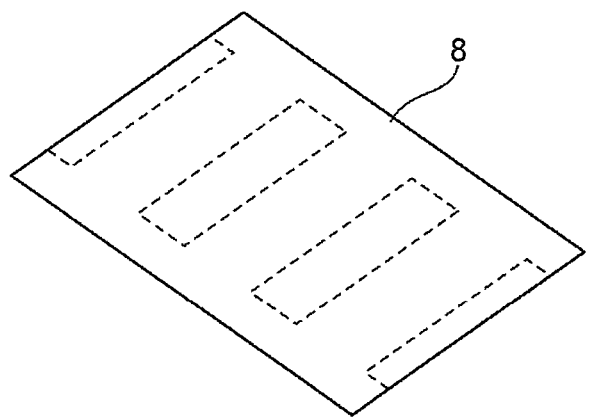
Figure 15:
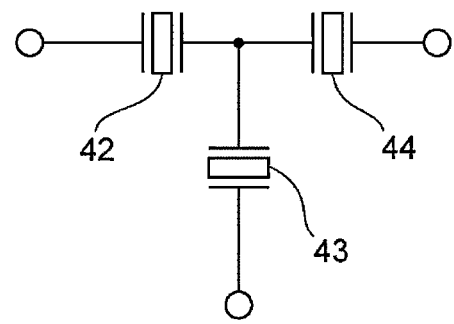
FIG. 15 is a circuit diagram of the acoustic wave device according to the fourth preferred embodiment of the present invention.

FIG. 14A is a perspective view of an acoustic wave device according to a fourth preferred embodiment of the present invention, and FIG. 14B is a perspective view illustrating electrodes on a lower surface of a piezoelectric body. An acoustic wave device 41 has a structure in which a plurality of acoustic wave resonators 42 to 44 are integrated. The acoustic wave resonator 42 has a structure the same as or similar to that of the acoustic wave device 1. That is, the side surface grooves 11 and 12 extending in the length direction of the piezoelectric body 4 are provided at both sides of the first electrode 5. The acoustic wave resonator 43 and the acoustic wave resonator 44 are also provided with the side surface grooves 11 and 12. Then, the side surface groove 12 and the side surface groove 11 continue to each other between the adjacent acoustic wave resonators 42 and 43. In this case, as illustrated in FIG. 14B, an electrode provided on the lower surface of the piezoelectric body 4 can define and function as the second electrode 8 as a common electrode. As a result, the configuration illustrated by the circuit diagram in FIG. 15 is achieved. As described above, in the present preferred embodiment, the plurality of acoustic wave resonators 42 to 44 are provided on the same support substrate 2, and a configuration of a T-shaped ladder filter circuit is included.

Note that regions surrounded by broken lines in FIG. 14B are regions in which the electrode is cut and does not exist in a case where the depth of the grooves is larger than the thickness of the piezoelectric body when the side surface grooves are provided. In addition, by making the electrode thicknesses of the three resonators and/or the thickness of the piezoelectric body different, it is possible to make the frequency different to define a desired filter.

Figure 16A:
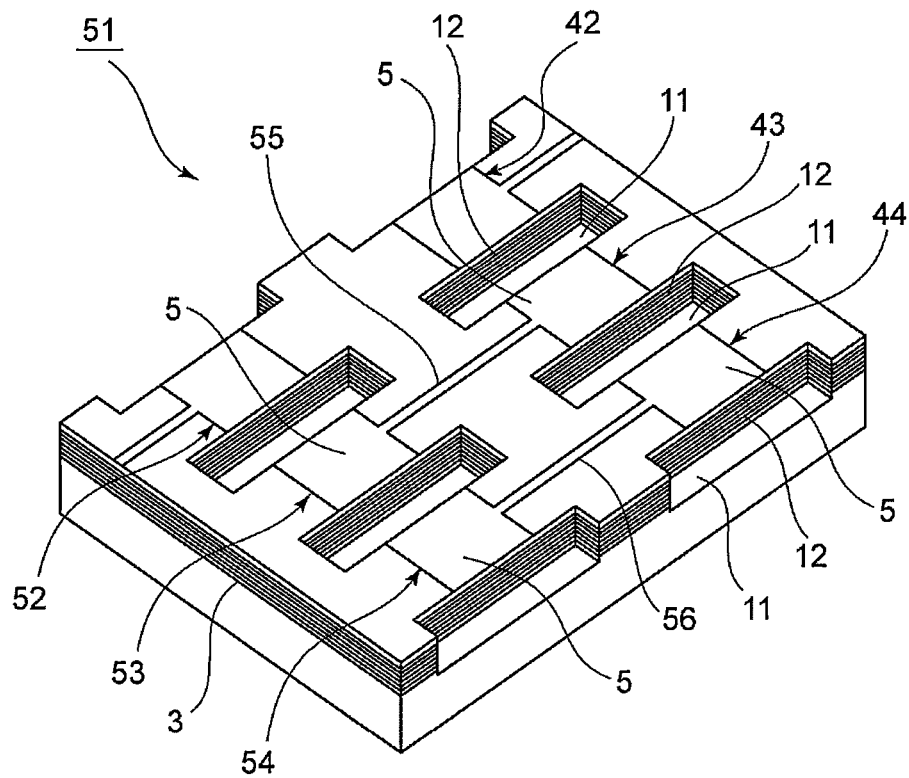
FIGS. 16A and 16B are perspective views of an acoustic wave device according to a fifth preferred embodiment of the present invention, and a perspective view for describing electrodes on a lower surface of a piezoelectric body, respectively.
Figure 16B:
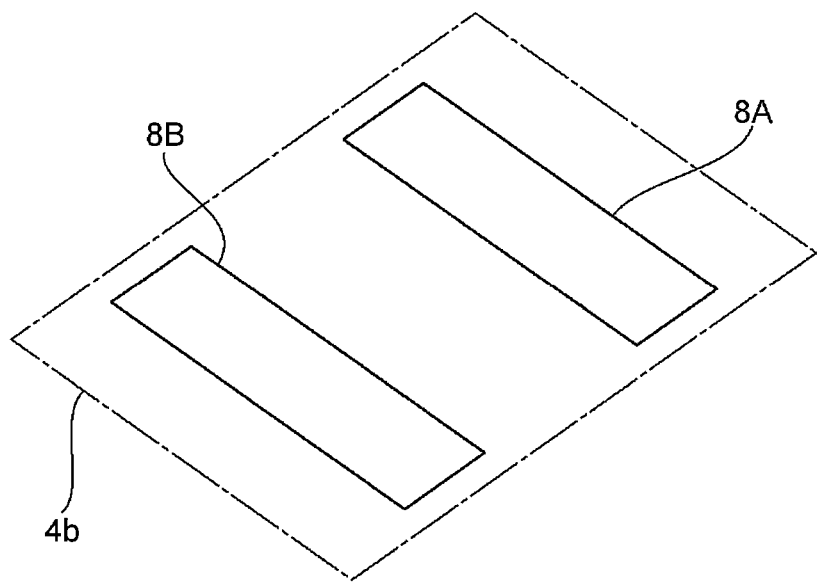

FIG. 16A is a perspective view of an acoustic wave device according to a fifth preferred embodiment of the present invention, and FIG. 16B is a perspective view for describing electrodes on a lower surface of a piezoelectric body of the acoustic wave device.

Figure 17:
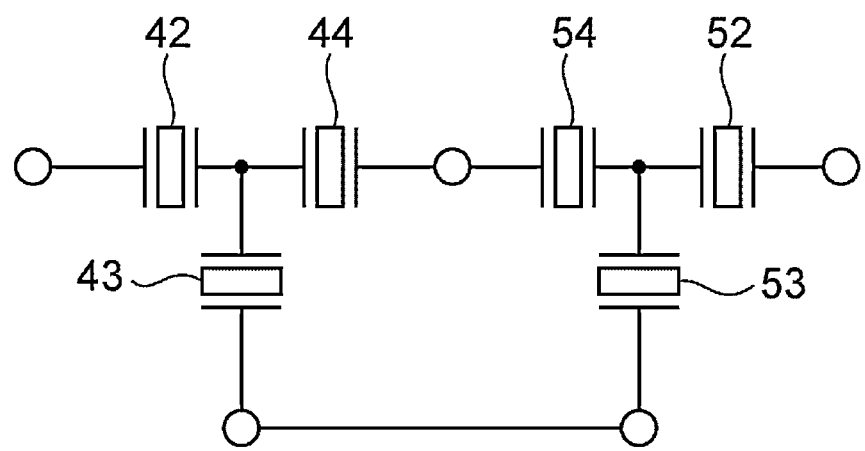
FIG. 17 is a circuit diagram of the acoustic wave device according to the fifth preferred embodiment of the present invention.

As in an acoustic wave device 51, in addition to the acoustic wave resonators 42 to 44, acoustic wave resonators 52 to 54 may be integrally provided in the length direction of the piezoelectric body 4. The acoustic wave resonators 52 to 54 are configured in the same or similar manner as the acoustic wave resonators 42 to 44. The first electrode 5 of the acoustic wave resonator 43 and the first electrode 5 of the acoustic wave resonator 53 are connected by a connection electrode 55. Similarly, the first electrode 5 of the acoustic wave resonator 44 and the first electrode 5 of the acoustic wave resonator 54 are connected by a connection electrode 56. In this case, second electrodes 8A and 8B defining and functioning as common electrodes are provided on the lower surface of the piezoelectric body. Thus, a filter circuit illustrated in FIG. 17 can be provided.

Here, the second electrodes 8A and 8B as the common electrodes have larger areas than that of the first electrode 5. In this manner, a plurality of second electrodes are made common by using the second electrodes 8A and 8B having the large areas. Also in the acoustic wave device 51, since a plurality of side surface grooves 11 and 12 are provided, it is possible to easily perform electrical connection with the outside or another electronic component element portion, for example, the adjacent acoustic wave resonator, at an outer side portion of the region in which the grooves are provided. The second electrode 8A and the second electrode 8B may be electrically connected to each other.

In addition, the second electrodes 8A and 8B may be electrically connected to each other or divided, depending on how the resonators are connected.

Figure 18A:
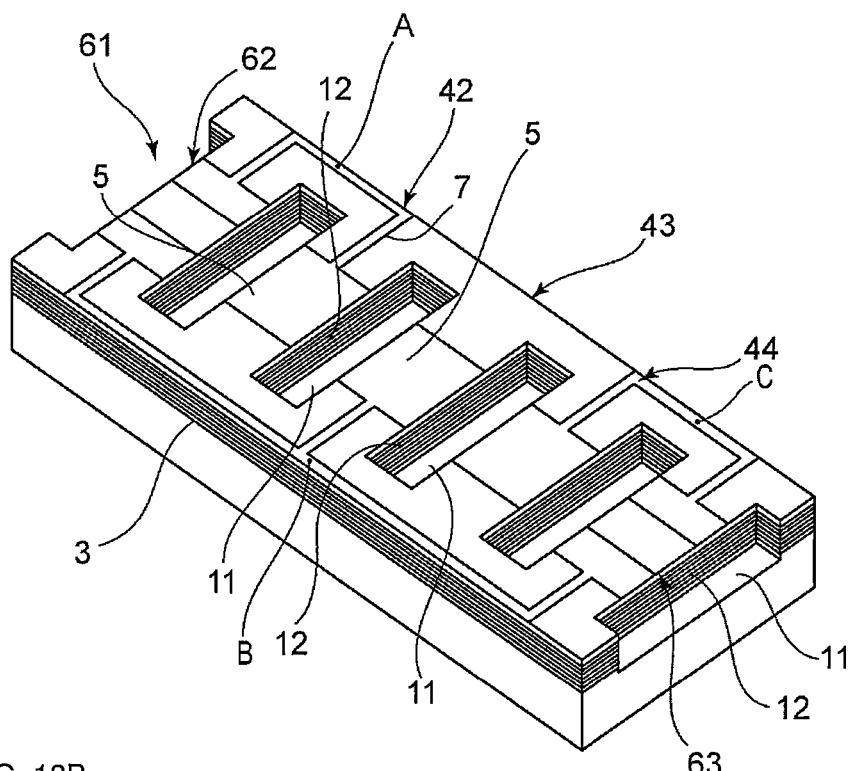
FIGS. 18A and 18B are a perspective view of an acoustic wave device according to a sixth preferred embodiment of the present invention, and a perspective view for describing electrodes on a lower surface of a piezoelectric body, respectively.
Figure 18B:
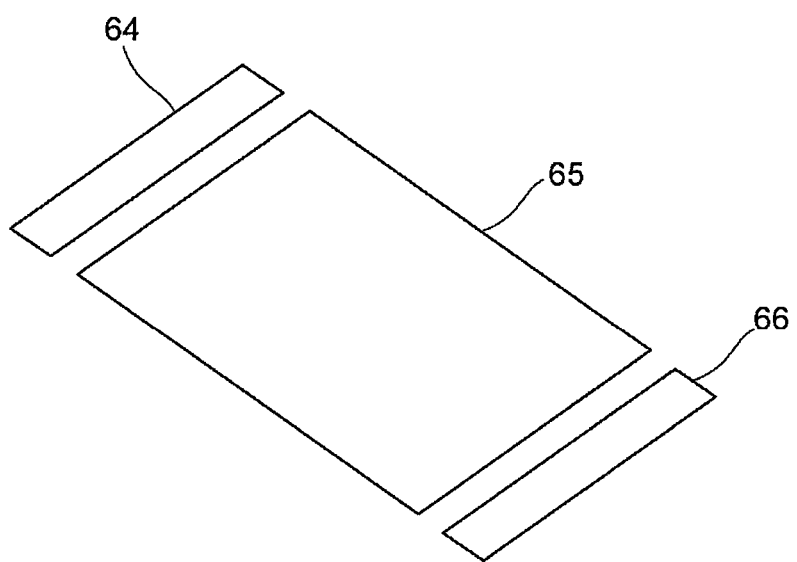

FIG. 18A is a perspective view of an acoustic wave device according to a sixth preferred embodiment of the present invention in which a portion of the acoustic wave device according to the third preferred embodiment illustrated in FIG. 11 and the acoustic wave device according to the fourth preferred embodiment illustrated in FIGS. 14A and 14B are combined, and FIG. 18B is a perspective view for describing electrodes on a lower surface of a piezoelectric body of the acoustic wave device. In FIG. 18A, in an acoustic wave device 61, acoustic wave resonators 62 and 63, in addition to the acoustic wave resonators 42 to 44, are integrated. Three electrodes 64 to 66 are provided, and all of the electrodes 64 to 66 are common electrodes.

Figure 19:
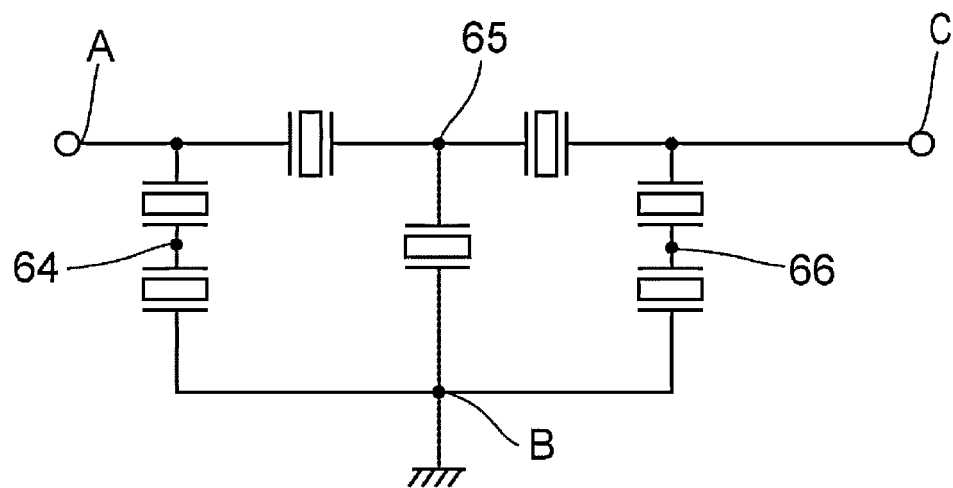
FIG. 19 is a circuit diagram of the acoustic wave device according to the sixth preferred embodiment of the present invention.

FIG. 19 is a circuit diagram of the acoustic wave device illustrated in FIGS. 18A and 18B, and a T-shaped ladder filter circuit is provided. Also in this structure, the electrodes 64, 65, and 66 may be divided into each electrode or connected to each other to be used for any connection method.

Acoustic wave devices 71, 81, and 91 according to seventh to ninth preferred embodiments of the present invention will be described. The acoustic wave devices 71, 81, and 91 are different in the vibration mode being used from the acoustic wave devices according to the first to sixth preferred embodiments. Additionally, as with the acoustic wave device 31, in the acoustic wave devices 71, 81, and 91 according to the seventh to ninth preferred embodiments, grooves are provided from the first main surface 4a side of the piezoelectric body 4, and a plurality of acoustic wave resonators are electrically connected to each other by using a plurality of electrodes provided on the second main surface of the piezoelectric body so as to avoid the grooves.

Figure 20:
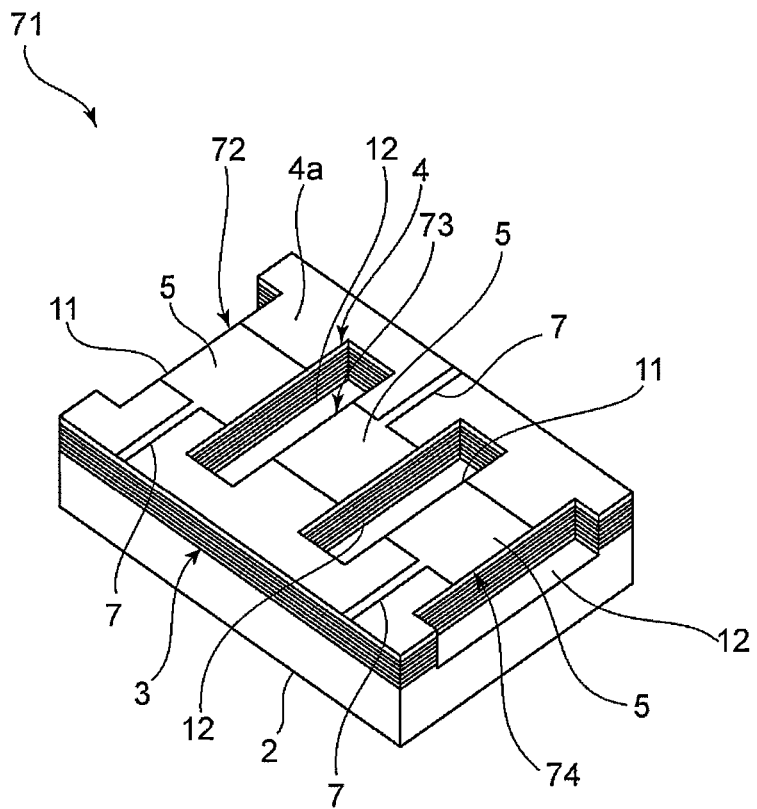
FIG. 20 is a perspective view of an acoustic wave device according to a seventh preferred embodiment of the present invention.

FIG. 20 is a perspective view of the acoustic wave device according to the seventh preferred embodiment. In the acoustic wave device 71, acoustic wave resonators 72 to 74 are integrated. In the acoustic wave resonators 72 to 74, the acoustic layer laminate 3 and the piezoelectric body 4 are laminated on the support substrate 2. Here, the side surface grooves 11 and 12 are provided in an outer side portion of the respective acoustic wave resonators 72 to 74. The first electrode 5 is provided on the first main surface 4a of the piezoelectric body 4. The first electrode 5 includes the lead-out electrode 7. As with the first preferred embodiment, the side surface grooves 11 and 12 are provided in at least a portion of the remaining region excluding the portion where the lead-out electrode 7 is provided from the outer side portion of the portion where the first electrode 5 is provided. In the acoustic wave device 71, the acoustic wave resonators 72 to 74 use width vibration of the side surfaces facing the side surface grooves 11 and 12.

Figure 21:
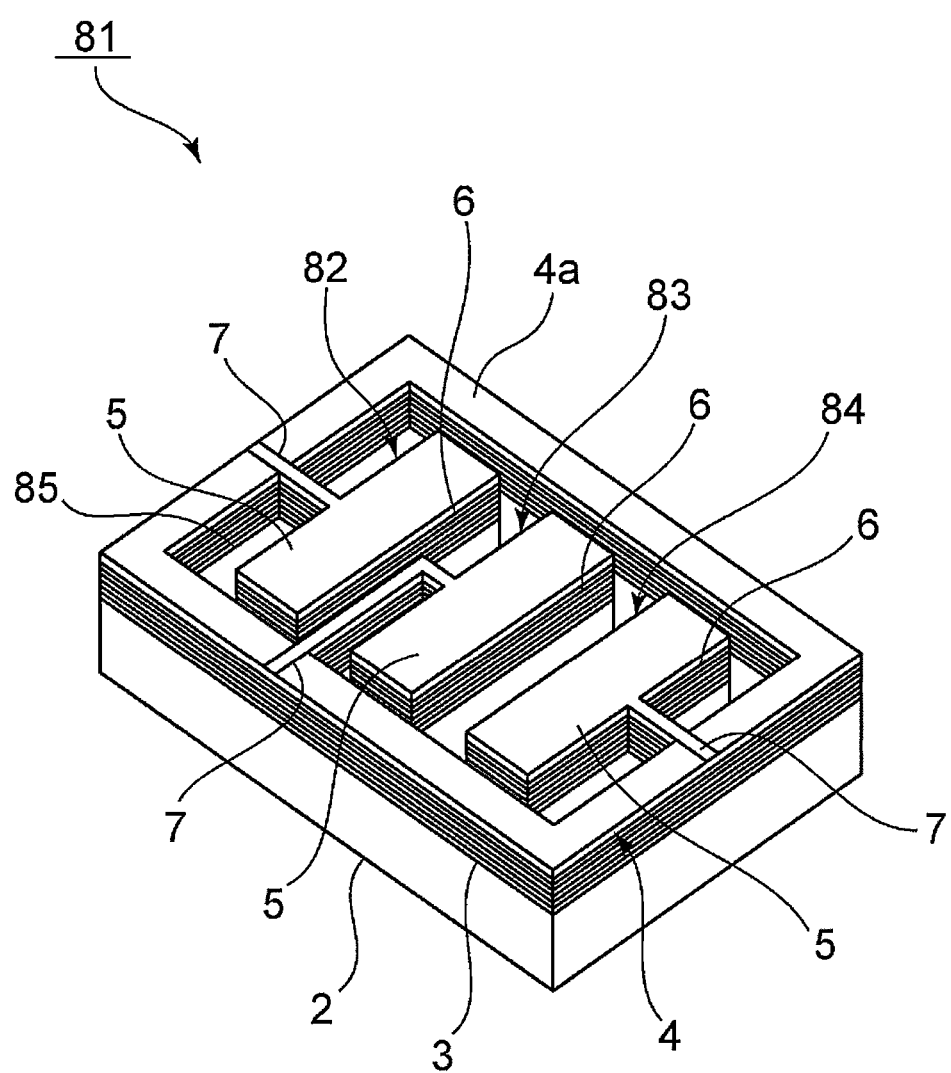
FIG. 21 is a perspective view of an acoustic wave device according to an eighth preferred embodiment of the present invention.

FIG. 21 is a perspective view of the acoustic wave device according to the eighth preferred embodiment. In the acoustic wave device 81, the acoustic layer laminate 3 and the piezoelectric body 4 are laminated on the support substrate 2, and the first electrode 5 is provided on the first main surface 4a of the piezoelectric body 4. The acoustic wave resonators 82 to 84 using length vibration of the side surface or the end surface having the larger dimension in the length direction or the width direction are provided. In each of the acoustic wave resonators 82, 83, and 84, the first electrode 5 is provided on the first main surface 4a of the piezoelectric body 4. The second electrode 6 is provided on the lower surface of the piezoelectric body 4 so as to be opposed to the first electrode 5.

Here, the lead-out electrode 7 is connected to the first electrode 5. In addition, a groove 85 is provided by hollowing out at least a portion of the remaining region excluding the portions where the lead-out electrodes 7 are provided from the region in the outer side portion of the regions in which the acoustic wave resonators 82 to 84 are provided.

Figure 22:
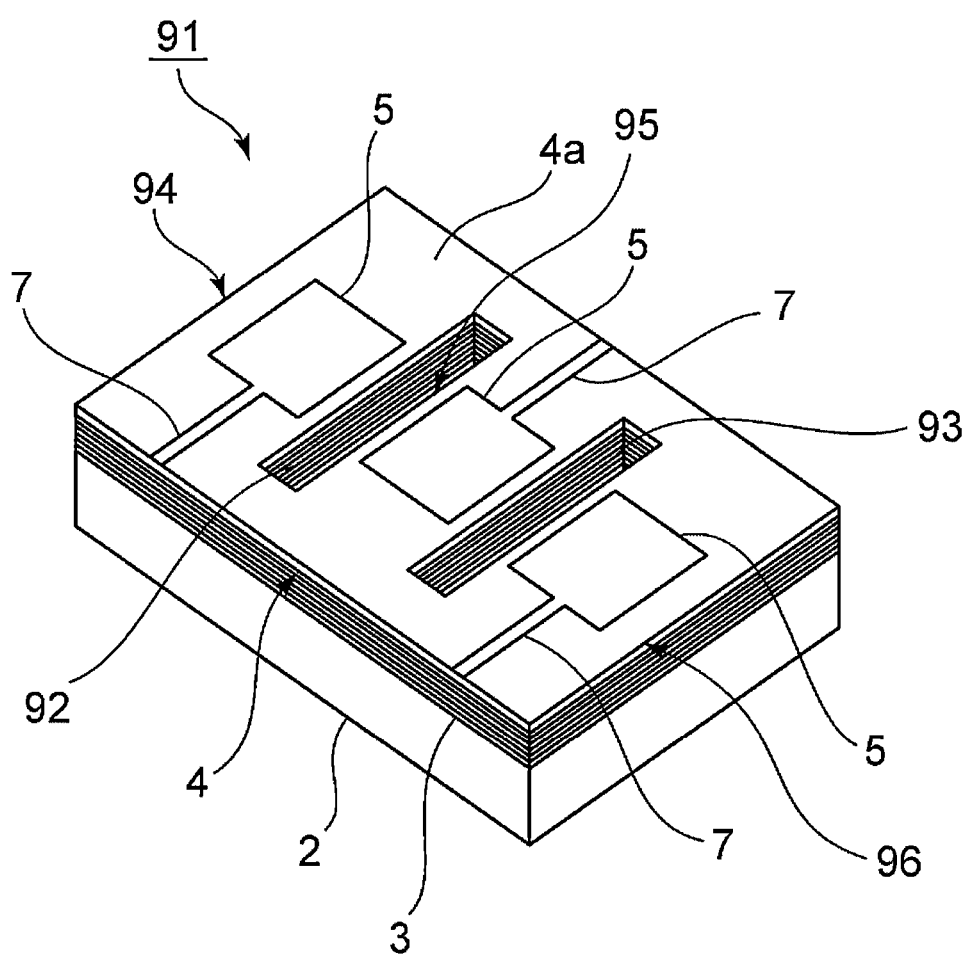
FIG. 22 is a perspective view of an acoustic wave device according to a ninth preferred embodiment of the present invention.

FIG. 22 is a perspective view of the acoustic wave device according to the ninth preferred embodiment.

The acoustic wave device 91 uses thickness vibration. The acoustic layer laminate 3 and the piezoelectric body 4 are laminated on the support substrate 2. Grooves 92 and 93 are provided from the first main surface 4a side of the piezoelectric body 4 so as to extend to a layer of the acoustic layer laminate 3. Further, in the acoustic wave device 91, the acoustic wave resonators 94 to 96 are integrally provided.

Each of the acoustic wave resonators 94 to 96 includes the first electrode 5 provided on the first main surface 4a and the second electrode provided on the second main surface. The lead-out electrode 7 is connected to the first electrode 5. Also in this case, the grooves 92 and 93 are provided in at least a portion of the remaining portion excluding the portions where the lead-out electrodes 7 are provided from the region in the outer side portion of the portions where the first electrodes 5 are provided. In the acoustic wave device 91, the acoustic wave resonators 94 to 96 use a thickness longitudinal mode.

As illustrated in FIG. 20 to FIG. 22, various vibration modes can be used in preferred embodiments of the present invention. Note that also in the acoustic wave devices 71, 81, and 91 respectively illustrated in FIG. 20 to FIG. 22, a circuit similar to that illustrated in FIG. 15 can be provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An acoustic wave device comprising:
a support substrate;
a piezoelectric body including a first main surface and a second main surface opposed to the first main surface;
a first electrode on the first main surface of the piezoelectric body;
a second electrode on the second main surface of the piezoelectric body;
an acoustic layer laminate between the second main surface and the support substrate; and
a lead-out electrode electrically connected to the first electrode or the second electrode and provided on the first main surface or the second main surface of the piezoelectric body; wherein the piezoelectric body includes a groove in at least a portion of a remaining portion excluding a portion provided with the lead-out electrode from a region in an outer side portion of at least one of the first electrode and the second electrode in a plan view from a thickness direction of the piezoelectric body; and the groove extends in a length direction of the piezoelectric body.

2. The acoustic wave device according to claim 1, wherein a depth of the groove is equal to or larger than a thickness of the piezoelectric body.

3. The acoustic wave device according to claim 1, wherein
the acoustic layer laminate includes a first acoustic layer and a second acoustic layer; and
a depth of the groove is equal to or larger than a total of a thickness of the piezoelectric body and thicknesses of the first acoustic layer and the second acoustic layer from a side of the piezoelectric body.

4. The acoustic wave device according to claim 1, wherein a depth of the groove is equal to or larger than a total of a thickness of the piezoelectric body and a thickness of the acoustic layer laminate.

5. The acoustic wave device according to claim 1, wherein the groove is non-parallel to outer peripheries of the first electrode and the second electrode.

6. The acoustic wave device according to claim 1, wherein
the groove includes grooves provided at each of both sides of the first electrode and the second electrode; and
each of the grooves is parallel or substantially parallel to outer peripheries of the first electrode and the second electrode.

7. The acoustic wave device according to claim 6, wherein the grooves at both sides of the first electrode and the second electrode are parallel or substantially parallel to each other.

8. The acoustic wave device according to claim 1, wherein the groove has a length equal to or larger than about 0.7 times a length of one side of each of the first electrode and the second electrode.

9. The acoustic wave device according to claim 1, wherein the groove has a length equal to or larger than about 0.87 times a length of one side of each of the first electrode and the second electrode.

10. The acoustic wave device according to claim 1, wherein at least a portion of the groove is non-linear.

11. The acoustic wave device according to claim 1, wherein a section of the groove in a thickness direction is inclined with respect to a direction orthogonal or substantially orthogonal to the first main surface and the second main surface of the piezoelectric body.

12. The acoustic wave device according to claim 11, wherein the section of the groove in the thickness direction is inclined at an inclination angle equal to or smaller than about 32° with respect to the direction orthogonal or substantially orthogonal to the first main surface of the piezoelectric body.

13. The acoustic wave device according to claim 1, wherein the piezoelectric body is made of $LiTaO_3$ or $LiNbO_3$.

14. The acoustic wave device according to claim 13, wherein a thickness shear mode is excited between the first electrode and the second electrode.

15. The acoustic wave device according to claim 1, wherein the piezoelectric body is made of AlN or ScAlN.

16. The acoustic wave device according to claim 13, wherein a thickness longitudinal mode is excited between the first electrode and the second electrode.

17. The acoustic wave device according to claim 1, further comprising:
an electrode defining an impedance element on the first main surface or the second main surface of the piezoelectric body; wherein
the groove is provided in at least a portion between the first electrode and the second electrode and the electrode defining the impedance element.

18. The acoustic wave device according to claim 1, wherein an area of the second electrode provided on the second main surface is equal to or larger than an area of the first electrode.

19. The acoustic wave device according to claim 18, further comprising:
a plurality of the acoustic wave devices; wherein
the plurality of acoustic wave devices are provided on a same support substrate to define a T-shaped ladder filter circuit.

20. The acoustic wave device according to claim 18, further comprising:
a plurality of the acoustic wave devices; wherein
the plurality of acoustic wave devices are provided on the same support substrate to define a x-shaped ladder filter circuit.

21. An acoustic wave filter device comprising:
a plurality of the acoustic wave devices according to claim 1; wherein
the groove is provided in at least a portion between the acoustic wave devices that are adjacent to each other.

22. An acoustic wave filter device comprising:
a piezoelectric body including a first main surface and a second main surface opposed to the first main surface;
a plurality of electrodes on each of the first main surface and the second main surface of the piezoelectric body;
an acoustic layer laminate laminated on the second main surface of the piezoelectric body and including a plurality of acoustic layers; and
a support substrate laminated on an opposite side of the acoustic layer laminate to the piezoelectric body; wherein
a plurality of acoustic wave resonators are defined by the piezoelectric body and the plurality of electrodes on each of the first main surface and the second main surface of the piezoelectric body; and
a groove is provided from a side of the first main surface of the piezoelectric body, and the plurality of acoustic wave resonators are electrically connected to each other by the plurality of electrodes on the second main surface of the piezoelectric body so as to avoid the groove.

* * * * *